United States Patent [19]

Vaughan et al.

[11] Patent Number: 4,888,555

[45] Date of Patent: Dec. 19, 1989

[54] PHYSIOLOGICAL PHANTOM STANDARD FOR NMR IMAGING AND SPECTROSCOPY

[75] Inventors: John T. Vaughan; Bret Lesan, both of Dallas, Tex.

[73] Assignee: The Board of Regents, The University of Texas, Austin, Tex.

[21] Appl. No.: 277,008

[22] Filed: Nov. 28, 1988

[51] Int. Cl.[4] ............................................. G01R 33/20
[52] U.S. Cl. ..................................... 324/318; 324/300
[58] Field of Search ............... 324/300, 307, 309, 318, 324/321; 128/653; 378/207

[56] References Cited

U.S. PATENT DOCUMENTS

| | | | |
|---|---|---|---|
| 4,528,510 | 7/1985 | Loeffler et al. | 324/309 |
| 4,551,678 | 11/1985 | Morgan et al. | 324/300 |
| 4,613,819 | 9/1986 | Chui | 324/308 |
| 4,618,826 | 10/1986 | Smith et al. | 324/308 |
| 4,625,168 | 11/1986 | Meyer et al. | 324/300 |
| 4,644,276 | 2/1987 | Sierocuk et al. | 324/307 |
| 4,692,704 | 9/1987 | Gray | 324/318 |
| 4,719,406 | 1/1988 | Schaefer et al. | 324/318 |
| 4,777,442 | 10/1988 | Rosenthal | 324/309 |
| 4,816,762 | 3/1989 | Bohning | 324/318 |

Primary Examiner—Tom Noland
Assistant Examiner—Kevin D. O'Shea
Attorney, Agent, or Firm—Arnold, White & Durkee

[57] ABSTRACT

A physiological phantom standard for NMR imaging and spectroscopy is provided for testing the entire range of image quality parameters over a region comparable to the physiological sample in size, NMR parameters, and RF conductivity. Included in these tests are: signal-to-noise, contrast-to-noise, geometric distortion, slice thickness, slice position, slice profile, slice flatness, T1 and T2 relaxation times, nucleii density, three dimensional spatial resolution, image uniformity, flip-angle accuracy, resonance frequency stabiltity, and positioning system alignment. NMR active materials fills substantially all of the enclosed volume of the phantom to more closely simulate conditions imposed by the anticipated object under test, such as a human subject. The phantom includes a set of coordinate system grids and an associated set of slice parameter grids. The phantom further provides a plurality of chambers which may enclose selectably different NMR active material. The present invention also includes a plurality of resolution scales located at various points throughout the phantom. Each element of the phantom used to provide the various image quality and system performance tests is substantially surrounded by NMR active and RF conductive material to simulate the environment of anticipated tissue to be tested. All tests can be performed substantially over the volume of the phantom without moving or reconfiguring the phantom.

14 Claims, 4 Drawing Sheets

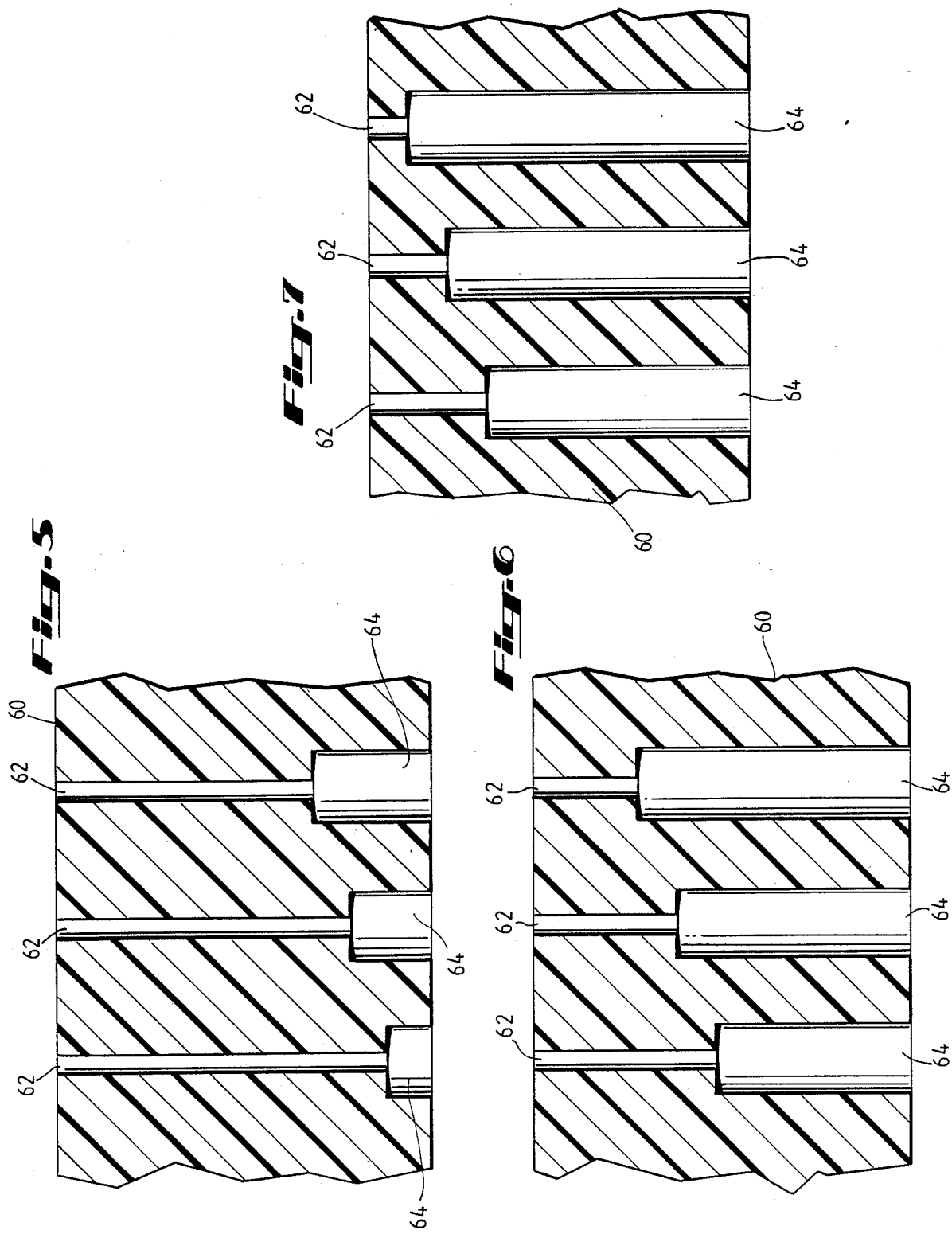

PHYSIOLOGICAL PHANTOM STANDARD FOR NMR IMAGING AND SPECTROSCOPY

BACKGROUND OF THE INVENTION

The present invention relates generally to Nuclear Magnetic Resonance (NMR) imaging test devices. More particularly, the invention relates to a physiological phantom for testing image quality, system performance and calibration characteristics of an NMR imaging (MRI) system. The phantom permits the system user to perform the entire series of image quality, system performance, and calibration tests with a single phantom. It also permits the user to perform these tests without repositioning the phantom or reconfiguring the phantom after repositioning.

Well known NMR techniques acquire spectroscopic and imaging information about the internal anatomical features of a subject, such as a human. A system operator analyzes this information to determine such tissue-related parameters as nuclear spin distribution, spin-lattice (T1), and/or spin-spin (T2) relaxation constants believed to be of medical diagnostic value in determining the state of health of tissue in the region examined. In the course of an examination, the system operator positions the patient region of interest in a substantially uniform, static ($B_o$) magnetic field produced by one of several known means, most commonly superconductive magnets. The MRI system operator collects spectroscopic and imaging data by subjecting the region of interest to pulse sequences comprised of magnetic field gradients and radio frequency (RF) pulses. Separate coil assemblies positioned in the polarizing magnetic field generate the magnetic gradient and RF fields. These fields have generally cylindrical configurations to accommodate the patient region to be studied. The resonant frequency of the RF coil is based on the strength of the static magnetic field and the type of nucleus (e.g., hydrogen, phosphorus, etc.) to be examined.

Known phantoms generally comprise test objects constructed to simulate structures and conditions encountered in actual use. The phantom can be made to simulate various types of tissue and, ideally, should simulate such tissue in its environment. That is, an organ under test, such as a heart or a liver, is generally surrounded in the human body by other NMR active tissue. So, a phantom that provides for testing a particular performance parameter, such as geometric distortion or slice thickness, should include a test element that is also generally surrounded by NMR active and radio frequency (RF) conductive material to more accurately portray NMR system performance. Further, such a phantom should provide test elements at a plurality of locations throughout the region of interest to determine system performance at various points.

Such a phantom can be used as a substitute test object in operator training, as a calibration device to determine the level of equipment performance, and as a standard by which to judge and predict image and spectra quality. In some cases, system operators may wish to determine the degree of equipment operability by daily calibration procedures. Therefore, use of the phantom must allow evaluation of multiple image-quality parameters with relative ease, and a minimum expenditure of operator time and effort. Accordingly, such a phantom should minimize such factors as scan time to acquire the test data, phantom set-up time, and cost. Conversely, such a phantom should maximize such factors as reliability, repeatability and simplicity.

Those skilled in the MRI art recognize that a test subject within an MRI system "loads" the RF coil. That is, the test subject provides a path of conduction for the RF energy produced by the RF coil. The RF load is related to the coil quality factor Q, the coil resonant frequency, the RF field distribution, and the impedance of the coil when the test subject is placed inside. Thus, for example, an "unloaded" RF coil may have a Q of approximately 250, while a coil with a 75 kg person positioned therein may have its Q lowered to 65. The load to the coil determines the amount of power required from the RF power amplifier necessary to perform the NMR experiment, and determines the level of noise which is included in the received NMR signal used to construct an image. If the load on the RF coil is too low, the RF system will not be stressed adequately, and the noise in the image will not be representative of that found in an anatomical image. Thus, a phantom should "load" the RF coil like the anticipated subject will load the coil.

This means, not only should the phantom present an overall load to the RF coil that approximates that of the anticipated subject, but this loading of the RF coil should be distributed throughout the entire region of interest. That is, the NMR active and RF conductive material within the phantom should be distributed as homogeneously as possible throughout the region of interest. Otherwise, images of the phantom will not accurately predict images of the physiological region of interest.

Further, one tissue type can effect the image presented by a nearby second tissue type. Similarly, a phantom will present an inaccurate image if the tissue simulating material is completely surrounded by a nonconductive, nonabsorptive material, such as acrylic or air. Consequently, a phantom should present tissue equivalent material in an environment like that of the anticipated test subject. For example, if an operator wishes to contrast gray matter and white matter in a patient's head, then the phantom should offer material that simulates one tissue type within an environment of the other tissue type.

SUMMARY OF THE INVENTION

The present invention provides an NMR imaging phantom that permits image parameter measurements in three orthogonal dimensions without requiring that the phantom be moved or reconfigured. A coordinate system grid in three orthogonal planes provides the capability for measuring geometric distortion and for locating and scaling other measurements. The coordinate system grid is shown to be cartesian, for example, but may be polar, cylindrical, etc. The phantom also provides a three dimensional grid of ramp members that permit slice thickness, profile and position measurements to be taken over substantially all of the volume of interest. The phantom provides a series of resolution scales that are inserted within the coordinate system grid so that resolution measurements can be taken over substantially all of the volume of interest. The present invention yields an additional advantage in that performance parameters are tested in volumes of the phantom that are surrounded by NMR active and RF conductive material, in much the same way as images are viewed in the human body. The present invention further provides an advantage in that physiologically similar NMR active and RF conductive material is present throughout a substantial volume of the body sized phantom thereby providing a more homogeneous image under test and more nearly simulating an image from the human body.

These and other features and advantages of the present invention will become more apparent to those of skill in the art when considered in light of the following description.

BRIEF DESCRIPTION OF THE DRAWINGS

FIGS. 5, 6, and 7 depict cross sectional views of a resolution scale member of the present invention.

DETAILED DESCRIPTION OF A PREFERRED EMBODIMENT

Figure 1:
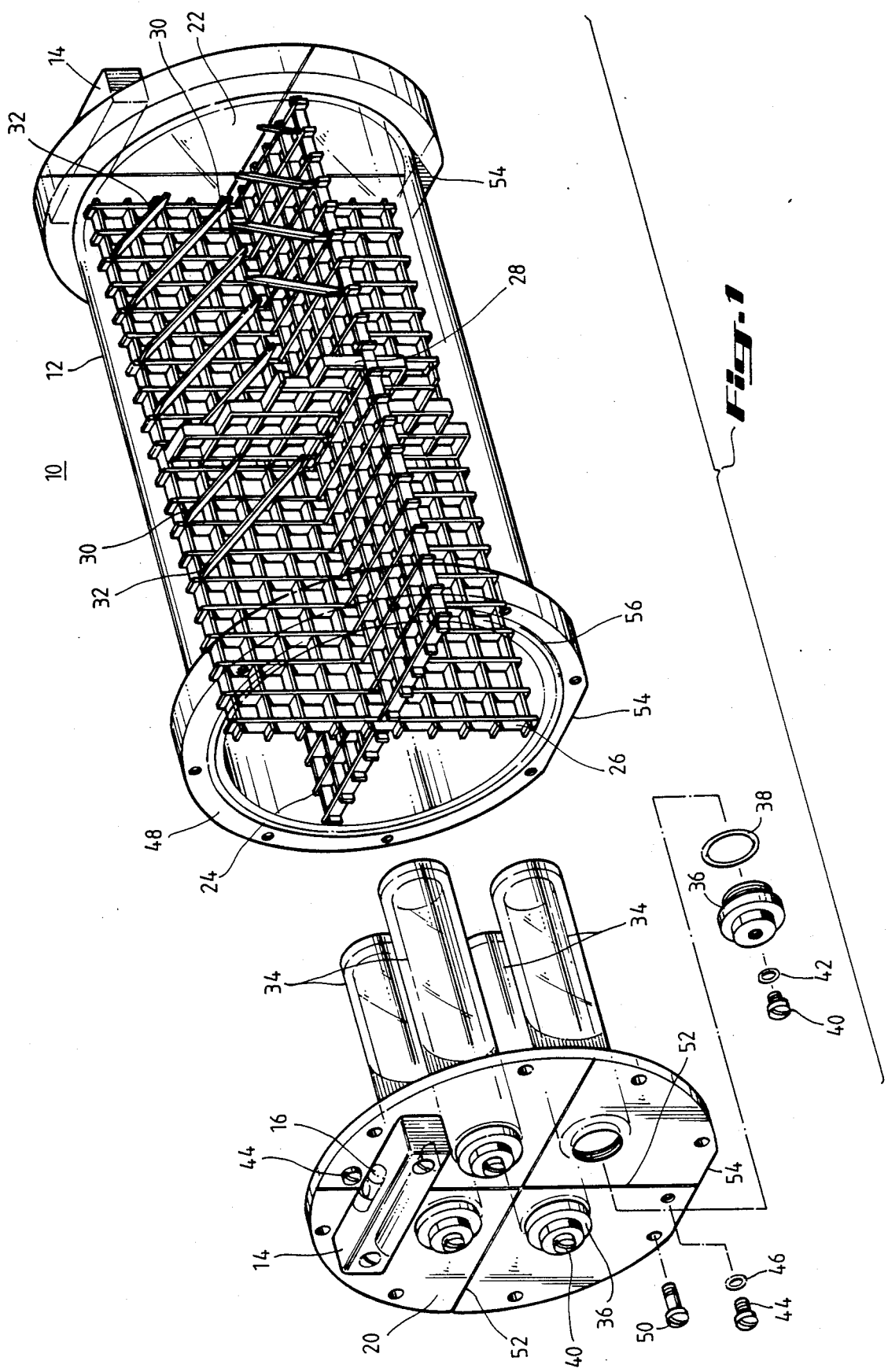
FIG. 1 presents an exploded, three-dimensional view of a preferred embodiment of the present invention.

FIG. 1 presents an exploded, three dimensional view of a phantom 10 of the present invention. The phantom 10 as a whole may be referred to as the overall or global phantom. The phantom 10 is generally cylindrical with a cylinder body 12, a front end-plate 20, and a rear end-plate 22. Each of the cylinder body 12, the front end-plate 20, and the rear end-plate 22 is made of a substantially non-NMR active material, such as acrylic. Together, the cylinder body 12, the front end-plate 20, and the rear end-plate 22 form an enclosed cylinder. In a preferred embodiment, the phantom 10 is approximately 16 long, the outside diameter of the cylinder body 12 is about 8 inches, and wall thickness of the cylinder body 12 is about ¼ inch. These dimensions are exemplary only.

The front end-plate 20 is removably attached to the cylinder body 12 at a front flange 48 by attaching screws 50. The front end-plate 20, the front flange 48, and the rear end-plate 22 each has a horizontal level surface 54 to ensure stable alignment of the phantom. These level-surfaces 54 provide a substantially flat base-support adapted for positioning the phantom on a positioning shelf with the NMR system. The front end-plate 20 seals to the front flange 48 by an end-plate gasket 56.

The front end-plate 20 includes a pair of phantom alignment marks or centerline positioning markers 52 etched on the surface of the endplate. The alignment marks 52 provide horizontal and vertical alignment of the phantom when used in conjunction with a laser alignment light. A similar pair of alignment marks is provided on the surface of the phantom 12 at the midpoint of the axis of the phantom. These marks are omitted from FIG. 1 for clarity.

The phantom of the present invention also provides a pair of carrying handles 14 to ease transport and manipulation of the phantom. A gravity-sensitive level element 16 provides indication of correctness of horizontal alignment. Another level element, not shown, may be provided along the cylinder body 12 to further ensure correct horizontal alignment.

In use, the enclose cylinder is filled with an NMR active, RF conductive material. The material may comprise a solution of agarose gel or some other polysaccharide gel solution. Different recipes for the material may be used for different field strengths. The gel solution may be combined with salts that dissociate in the gel, such as copper sulphate or gadolinium chloride, to determine T1 and T2 relaxation times. The gel solution may also include a conductive salt, such as sodium chloride, to make the gel in the enclosure closely approximate the conductivity of the human body or human head, depending on the subject of interest. Since the front end-plate 20 is removably attached, molten gel solution can be poured, or solid gel can be packed into the phantom enclosure and then heated to melt the solution and to vent any entrained air.

Figure 2:
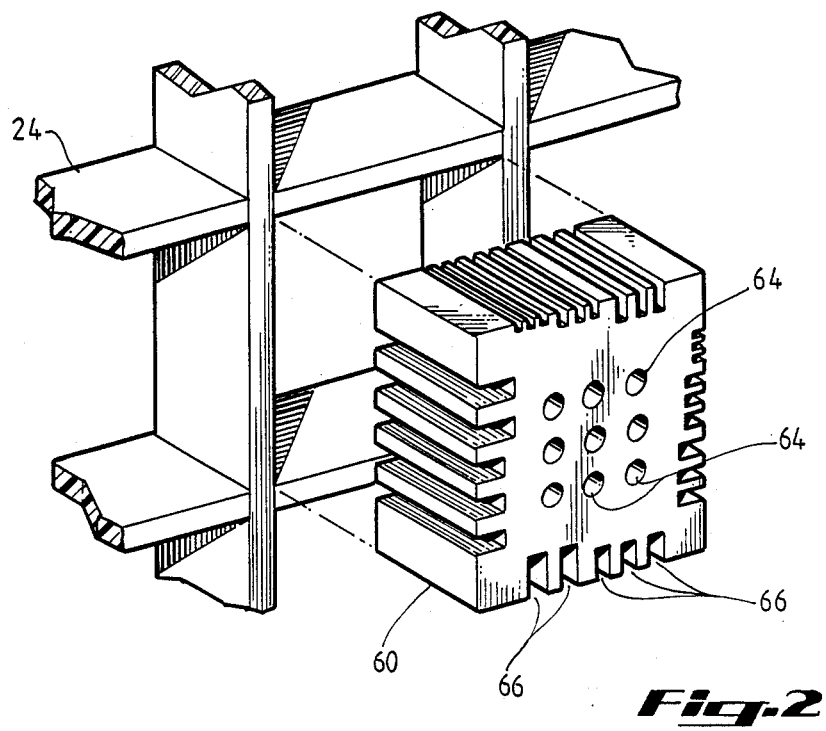
FIG. 2 depicts a three-dimensional view of a resolution scale member used in the present invention.

Within the phantom enclosure is a set of coordinate system grid-plates 24,26,28. The grid-plate 24 is horizontal and is aligned along the cylindrical axis of the phantom. The grid-plate 24 will be referred to as the "coronal" grid-plate because this grid-plate corresponds to the coronal plane of a supine patient. The grid-plate 26 is oriented vertically and is also aligned along the cylindrical axis of the phantom. The grid-plate 26 will be referred to as the "sagittal" grid-plate because this grid-plate corresponds to the sagittal plane of a supine patient. The grid-plate 28 is also vertical and is perpendicular to the axis of the phantom. The grid-plate 28 will be referred to as the "transverse" grid-plate because this grid-plate corresonds to the transverse plane of a supine patient. Each of the grid-plates 24,26,28 is sized to receive a set of resolution grid elements or resolution scales 60, as shown in FIG. 2.

Also within the phantom enclosure is a grid of two sizes of slice-parameter ramps 30,32. As used in this context, the term "grid" includes the series of ramps 30,32 that are preferably oriented at a 45° angle. The smaller ramps 30 are thinner and narrower than the larger ramps 32. In a preferred embodiment, the smaller slice-parameter ramps 30 are approximately 1/16 inch thick and approximately ¼ inch wide. The larger ramps 32 are approximately ⅛ inch thick and 0.4 inch wide. The present invention provides alternating slice-parameter ramps 30,32 adjacent to each of the coronal, sagittal, and transverse grid-plates. Some of the ramps 30,32 are deleted from FIG. 1 for clarity.

Figure 4:
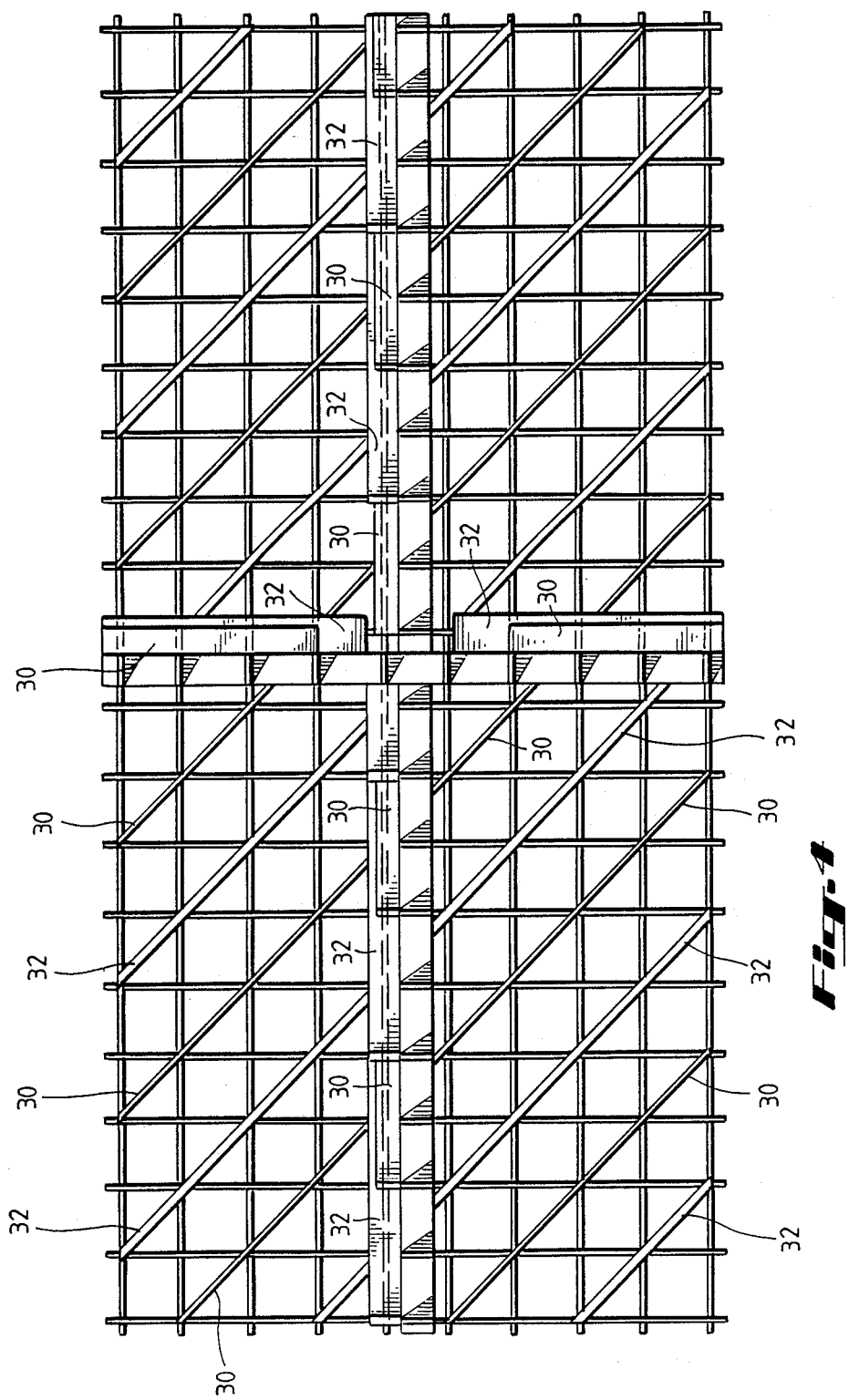
FIG. 4 depicts a side view of a coordinate system grid and associated slice-parameter ramp grid of the present invention.

FIG. 4 depicts the arrangement of the slice-parameter ramps 30,32. A set of ramps 30,32 is provided in each of the sagittal, coronal, and transverse planes. Smaller ramps 30 alternate with larger ramps 32. The larger ramps 32 may be used for thicker imaging slices such as, for example, 5 mm and thicker. The smaller ramps 30 may be used for thinner slices such as, for example, slices less than 5 mm thick. Providing alternating sizes of ramps 30,32 provides an additional measure of slice "flatness" and phantom alignment in any of the three major planes for center slices. Slice "flatness" is a measure of how closely an actual slice varies from a perfectly flat plane. Slice position and thickness throughout the volume are measured by comparing the width and location of the ramp projection of an image slice, to its adjacent coordinate system grid also imaged. Thus, the coordinate system grid serves as a scale and as a position locator for the slice-parameter grid.

A preferred embodiment of the phantom provides a plurality of flood-field tubes 34. The flood-field tubes 34 may be generally cylindrical and cantilevered into the interior of the phantom enclosure. Each flood-field tube 34 is sealed with a tube-cap 36 and a tube-cap O-ring 38. A tube-cap ventplug 40 eliminates hydraulic pressure in the flood-field tube 34 when the tube-cap 36 is installed. A tube-cap ventplug O-ring 42 seals each tube-cap ventplug 40.

The flood-field tubes 34 provide cavities or chambers into which may be placed selectable NMR tissue equivalent solutions. These solutions may be selected to have T1, T2, proton, and/or other nucleii densities different from each other and the global phantom. With front end-plate 20 with its attached flood-field tubes 34 in place on the phantom cylinder 12, the flood-field tubes 34 are surrounded by NMR active and RF conductive material. The flood-field tubes 34 present a "wide mouth" aspect so that material other than a liquid, such as tissue samples, can be placed in them and removed from them. Relaxation, nucleii population, and nucleii species parameters can be measured from image slices through the flood field tubes. FIG. 1 depicts the flood field tubes as cylindrical members but any chamber or cavity shape, adapted to hold tissue-equivalent solutions, is adequate and within the spirit of the present invention. Further, these chambers need not be cantilevered into the interior of the phantom but can enter at any convenient spot on the cylinder body 12 or one of the end-plates.

Phantom enclosure vent-plugs 44 are used for final filling of the phantom after the front end-plate 20 is installed, and to vent entrained air from the phantom enclosure. Each phantom enclosure vent-plug 44 is sealed by a phantom enclosure ventplug O-ring 46.

Figure 3:
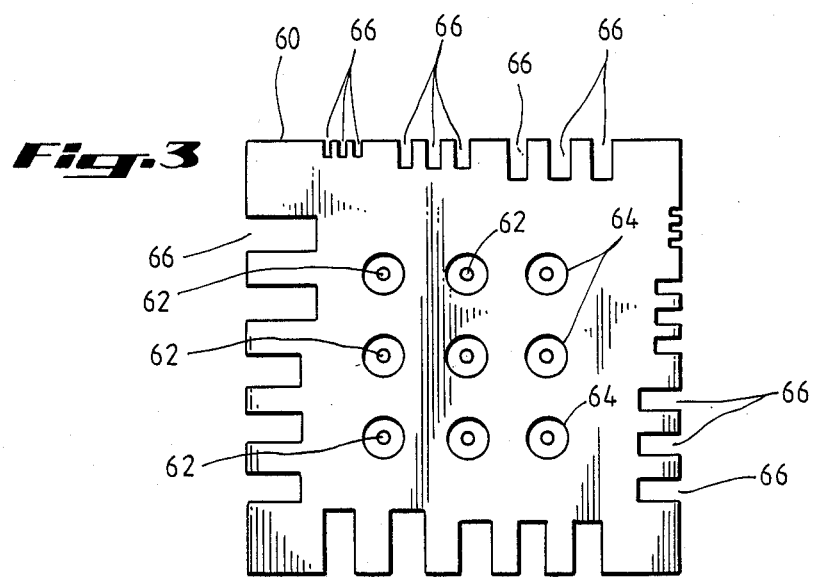
FIG. 3 depicts a side view of a resolution scale member of the present invention.

FIGS. 2 and 3 depict three-dimensional and side views of a resolution scale 60. The resolution scales 60 include signal-locator holes 62, in a preferred embodiment of approximately 0.5 mm in diameter. Slice selection resolution test capability is provided by counterbores 64 that vary incrementally in depth. In a preferred embodiment, each counterbore is approximately 2 mm in diameter. The resolution scales also include a plurality of notches 66 of varying sizes to further provide measurement of spacial resolution independently in the phase-encoding and frequency-encoding directions. The signal locator holes and the notches allow the gel or other NMR active material to flow through to either side of the scale. The resolution scale elements may be placed at various locations near the center of the phantom enclosure and at the extremities of the phantom enclosure to provide a global view of resolution throughout the test subject. This provides resolution scales within the range of surface coils commonly in use.

FIGS. 5, 6, and 7 depict cross-sections of a resolution scale to show the varying depths of the counter bores 64. The signal-locator holes 62 penetrate the entire thickness of the resolution scale 60 and the counter bores may vary in depth incrementally from 0.3 to 2.7 mm, for example.

The principles, preferred embodiments and modes of using the phantom of the present invention have been described in the foregoing specification. The invention is not to be construed as limited to the particular forms disclosed since these are regarded as illustrative rather than restrictive. Moreover, variations and changes may be made by those skilled in the art without departing from the spirit of the invention.

We claim:

1. A Nuclear Magnetic Resonance imaging phantom comprising:
   a. a non-conductive cylindrical container fillable with an RF conductive, NMR active solution;
   b. a cruciform shaped non-conductive coordinate system grid within and oriented along the axis of the container;
   c. a non-conductive transverse coordinate system grid within and orthogonal to the axis of the container;
   d. resolution scales positionable within the cruciform shaped grid and the transverse grid; and
   e. a hollow chamber within the container, said chamber being fillable with a selectable contrast agent.

2. A Nuclear Magnetic Resonance imaging phantom comprising:
   a. a non-conductive enclosure, said enclosure having an elongated body, a first end, and a second end, wherein at least one of the ends is removable;
   b. a sagittal non-conductive grid-plate within the enclosure;
   c. a coronal non-conductive grid-plate within the enclosure;
   d. a transverse non-conductive grid-plate within the enclosure;
   e. a resolution scale within at least one of the gridplates;
   f. a slice-parameter ramp grid within the enclosure; and
   g. a flood-field chamber within the enclosure.

3. The phantom of claim 1 wherein said hollow chamber is fillable from outside the container.

4. The phantom of claim 1 further comprising slice-parameter ramp grids.

5. The phantom of claim 4 wherein the slice-parameter ramp grids are of at least two different sizes.

6. The phantom of claim 1 wherein said container includes a removable end-plate.

7. The phantom of claim 6 wherein said chamber is rigidly attached to said endplate and is cantilevered into the container.

8. The phantom of claim 4 wherein ramp grids are aligned along each of the coordinate system grids.

9. The phantom of claim 1 wherein said resolution scales provide means of measuring spatial resolution independently in the phase, frequency, and slice-encoding directions.

10. The phantom of claim 1 further comprising a gravity sensitive level.

11. The phantom of claim 1 further comprising a centerline positioning marker on the surface of the phantom.

12. The phantom of claim 1 further comprising a substantially flat base-support adapted for positioning the phantom on a positioning shelf within an imaging system.

13. The phantom of claim 8 wherein the ramp grids are comprised of ramp grid members and wherein the ramp grid members are of two or more alternating widths.

14. A Nuclear Magnetic Resonance imaging phantom comprising:
   a. a coordinate system grid;
   b. a slice-parameter ramp grid adjacent to the coordinate grid; and
   c. a resolution scale in each of three orthogonal planes.

* * * * *